United States Patent
Hirata (10) Patent No.: US 8,229,712 B2
(45) Date of Patent: Jul. 24, 2012

(54) ANALYSIS METHOD USING FINITE ELEMENT METHOD, PROGRAM CAUSING COMPUTER TO EXECUTE SAME, AND SYSTEM FOR SAME

(75) Inventor: Ichiro Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 104 days.

(21) Appl. No.: 12/461,580

(22) Filed: Aug. 17, 2009

(65) Prior Publication Data

US 2009/0312991 A1 Dec. 17, 2009

Related U.S. Application Data

(63) Continuation of application No. 10/157,499, filed on May 30, 2002, now abandoned.

(30) Foreign Application Priority Data

May 31, 2001 (JP) ................................. 2001-164730

(51) Int. Cl.
*G06F 17/50* (2006.01)

(52) U.S. Cl. ............. 703/1; 703/2; 703/6; 703/7; 703/8; 716/119

(58) Field of Classification Search .................. 703/1, 2, 703/6–8; 700/98; 716/20, 119
See application file for complete search history.

(56) References Cited

U.S. PATENT DOCUMENTS

| 4,933,889 | A | * | 6/1990 | Meshkat et al. | ................... 703/2 |
| 4,941,114 | A | * | 7/1990 | Shigyo et al. | ................... 716/51 |
| 5,125,038 | A | * | 6/1992 | Meshkat et al. | ................ 382/154 |
| 5,315,537 | A | * | 5/1994 | Blacker | ........................... 716/51 |
| 5,408,638 | A | | 4/1995 | Sagawa et al. | |
| 5,590,261 | A | | 12/1996 | Sclaroff et al. | |

(Continued)

FOREIGN PATENT DOCUMENTS

JP 7-262171 a 10/1995

OTHER PUBLICATIONS

J. S. Sun, K. H, Lee, and H. P. Lee "Comparison of implicit and explicit finite element methods for dynamic problems" 2000 Elsevier Science, pp. 110-118.*

(Continued)

*Primary Examiner* — Kamini S Shah
*Assistant Examiner* — Kibrom Gebresilassie
(74) *Attorney, Agent, or Firm* — Foley & Lardner LLP (57) ABSTRACT

An FEM analysis system is provided which is capable of analyzing with high accuracy and within a short time in a drop shock analysis of electronic devices in which a very small mesh size is incorporated. Processing to be performed by an optimal solution selecting and analyzing section includes a step of checking whether an analysis to be performed is a shock analysis, a step of searching for a minimum mesh size when the analysis to be performed is judged to be a shock analysis, a step of creating a simplified analysis model using the minimum mesh size, a step of performing a preliminary analysis on a simplified model by an implicit method and explicit method, and a step of selecting either of the implicit method or explicit method as an optimal analysis method by comparing results from preliminary analysis, results from these analyses and experiments or exact solution.

6 Claims, 2 Drawing Sheets

U.S. PATENT DOCUMENTS

| | | | | |
|---|---|---|---|---|
| 5,617,322 | A * | 4/1997 | Yokota | 700/98 |
| 5,838,594 | A * | 11/1998 | Kojima | 703/2 |
| 5,946,479 | A * | 8/1999 | Sakaguchi et al. | 716/51 |
| 6,064,810 | A * | 5/2000 | Raad et al. | 703/23 |
| 6,353,768 | B1 * | 3/2002 | Karafillis et al. | 700/97 |
| 6,505,326 | B1 * | 1/2003 | Farral et al. | 716/136 |
| 6,526,550 | B1 * | 2/2003 | Badding et al. | 703/2 |
| 6,560,570 | B1 * | 5/2003 | Dohrmann et al. | 703/7 |
| 6,570,568 | B1 * | 5/2003 | Horn et al. | 345/428 |
| 6,618,694 | B1 * | 9/2003 | Shibuya et al. | 703/1 |
| 6,662,125 | B2 | 12/2003 | Namiki | |
| 6,678,642 | B1 * | 1/2004 | Budge | 703/2 |
| 6,714,901 | B1 | 3/2004 | Cotin et al. | |
| 6,718,290 | B1 * | 4/2004 | Szymczak et al. | 703/2 |
| 6,727,898 | B2 * | 4/2004 | Hariya et al. | 345/420 |
| 6,789,051 | B1 * | 9/2004 | Chen et al. | 703/2 |
| 6,804,635 | B1 | 10/2004 | Dohondt | |
| 6,823,244 | B2 | 11/2004 | Breed | |
| 6,904,395 | B1 * | 6/2005 | DeJack et al. | 703/7 |
| 6,947,879 | B2 * | 9/2005 | Yamada et al. | 703/2 |
| 6,999,908 | B2 * | 2/2006 | Yang et al. | 703/1 |
| 7,043,413 | B2 * | 5/2006 | Ward et al. | 703/10 |
| 7,167,816 | B1 * | 1/2007 | Olovsson | 703/1 |
| 7,228,519 | B2 * | 6/2007 | Aoki et al. | 716/50 |
| 7,286,972 | B2 * | 10/2007 | Maker | 703/7 |
| 7,321,365 | B2 * | 1/2008 | Brombolich | 345/420 |
| 7,324,103 | B2 * | 1/2008 | Stewart et al. | 345/420 |
| 7,363,198 | B2 | 4/2008 | Balaniuk et al. | |
| 7,395,128 | B2 | 7/2008 | Zhu et al. | |
| 7,454,320 | B1 * | 11/2008 | James | 703/2 |
| 7,467,074 | B2 * | 12/2008 | Faruque et al. | 703/8 |
| 7,657,408 | B2 * | 2/2010 | Ishikawa | 703/2 |
| 7,733,339 | B2 * | 6/2010 | Laning et al. | 345/420 |
| 7,953,578 | B2 * | 5/2011 | Roger et al. | 703/1 |
| 8,010,326 | B2 * | 8/2011 | Senecal et al. | 703/6 |
| 8,073,660 | B2 * | 12/2011 | Ishikawa et al. | 703/2 |
| 2002/0032550 | A1 * | 3/2002 | Ward et al. | 703/2 |
| 2002/0042697 | A1 * | 4/2002 | Yamada et al. | 703/2 |
| 2002/0042703 | A1 | 4/2002 | Furusu et al. | |
| 2002/0072883 | A1 * | 6/2002 | Lim et al. | 703/2 |
| 2002/0077795 | A1 * | 6/2002 | Woods et al. | 703/6 |
| 2002/0120430 | A1 * | 8/2002 | Yang et al. | 703/2 |
| 2002/0177983 | A1 | 11/2002 | Maker | |
| 2002/0183992 | A1 | 12/2002 | Ayache et al. | |
| 2002/0183993 | A1 | 12/2002 | Hirata | |
| 2003/0055617 | A1 | 3/2003 | Iwasaki et al. | |
| 2005/0134586 | A1 * | 6/2005 | Koo et al. | 345/423 |
| 2006/0044309 | A1 * | 3/2006 | Kanai et al. | 345/423 |
| 2006/0294436 | A1 * | 12/2006 | Sakai | 714/39 |
| 2007/0038430 | A1 * | 2/2007 | Walker et al. | 703/14 |
| 2007/0088536 | A1 * | 4/2007 | Ishikawa | 703/21 |
| 2007/0233436 | A1 * | 10/2007 | Ishikawa | 703/2 |
| 2008/0246766 | A1 * | 10/2008 | Yokohari et al. | 345/423 |
| 2009/0157373 | A1 * | 6/2009 | Ishikawa et al. | 703/13 |
| 2009/0249264 | A1 * | 10/2009 | Uriu et al. | 716/3 |
| 2010/0156903 | A1 * | 6/2010 | Kanai et al. | 345/420 |

OTHER PUBLICATIONS

J. S. Sun, K. H, Lee, and H. P. Lee "Comparison of implicit and explicit finite element methods for dynamic problems" pp. 110-118, Elsevier 2000.*

K.H. Low, A. Yang, K.H.Hoon, X. Zhang, Judy K.T. Lim, K. L. Lim, "Initial study on the drop-impact behavior of mini Hi-fi audio products" Advances in Engineering Software 32 (2001), pp. 683-693.*

Wu et al., "Drop/Impact Simulation and Test Validation of Telecommunication Products," *IEEE*, pp. 330-336 (1998).

Sun et al., "Comparison of implicit and explicit finite element methods for dynamic problems," *Journal of Materials Processing Technology*, vol. 105, pp. 110-118 (2000).

Low et al., "Initial study on the drop-impact behavior of mini Hi-Fi audio products," *Advances in Engineering Software*, vol. 32, Issue 9, pp. 683-693 (Sep. 2001).

Hirata et al., "Drop-Simulation of Electronic Boards Mounted with CSP's," *IEEE*, 2001, Production Technology Laboratories, pp. 309-313.

Yu et al., "Dynamic Behavior of Electronics Package and Impact Reliability of BGA solder Joints," *IEEE*, 2002, pp. 953-960.

EM-1110-2-2201, Chapter 6, *Static Analysis*, pp. 6-1 to 6-20, May 31, 1994.

Office Action issued on Jul. 9, 2009 by the Examiner in U.S. Appl. No. 10/157,499.

Office Action issued on Mar. 18, 2009 by the Examiner in U.S. Appl. No. 10/157,499.

Office Action issued on Jul. 31, 2008 by the Examiner in U.S. Appl. No. 10/157,499.

Office Action issued on Apr. 15, 2008 by the Examiner in U.S. Appl. No. 10/157,499.

Office Action issued on Sep. 24, 2007 by the Examiner in U.S. Appl. No. 10/157,499.

Office Action issued on Mar. 7, 2007 by the Examiner in U.S. Appl. No. 10/157,499.

Office Action issued on Sep. 28, 2006 by the Examiner in U.S. Appl. No. 10/157,499.

Office Action issued on Apr. 7, 2006 by the Examiner in U.S. Appl. No. 10/157,499.

Office Action issued on Oct. 19, 2005 by the Examiner in U.S. Appl. No. 10/157,499.

* cited by examiner

ANALYSIS METHOD USING FINITE ELEMENT METHOD, PROGRAM CAUSING COMPUTER TO EXECUTE SAME, AND SYSTEM FOR SAME

CROSS-REFERENCE TO RELATED PATENT APPLICATIONS

This application is a continuation of application Ser. No. 10/157,499, filed May 30, 2002, now abandoned, and based on Japanese Patent Application No. 2001-164730, filed May 31, 2001, by Ichiro Hirata, which is incorporated herein by reference in its entirety. This application claims only subject matter disclosed in the parent application and therefore presents no new matter.

BACKGROUND OF THE INVENTION

1. Field of the Invention

The present invention relates to a drop shock analysis system using an FEM (Finite Element Method) and more particularly to an analysis method using the FEM for analyzing a drop shock of an electronic device, a program for the analysis by the FEM method, and an FEM analysis system.

The present application claims priority of Japanese Patent Application No. 2001-164730 filed on May 31, 2001, which is hereby incorporated by reference.

2. Description of the Related Art

Since it is expected that, by using a stress analysis (by way of simulation) based on an FEM, a number of times of manufacturing a prototype and of experiments can be reduced and a development period can be shortened, the stress analysis using the FEM is now being carried out increasingly in businesses or universities.

The stress analysis can be classified into two types, one being a static analysis and another being a dynamic analysis. A method for the stress analysis can also be classified into two types, one being an implicit method and another being an explicit method. These two methods are different from each other in that an expression of the implicit method contains a spring constant "k" as a matrix, thereby forming a non-diagonal matrix and an expression of the explicit method contains a mass "m" as a matrix, thereby forming a diagonal matrix. Therefore, when the stress analysis is performed, an inverse matrix calculation of the spring constant "k" takes more time than an inverse matrix calculation of the mass "m". Moreover, in the case of the implicit method, a simultaneous linear equation is solved so that an equilibrium condition is satisfied and therefore accuracy of a stress analysis is higher compared with the explicit method, however, more time is required for the analysis compared with the explicit method.

Figure 4:
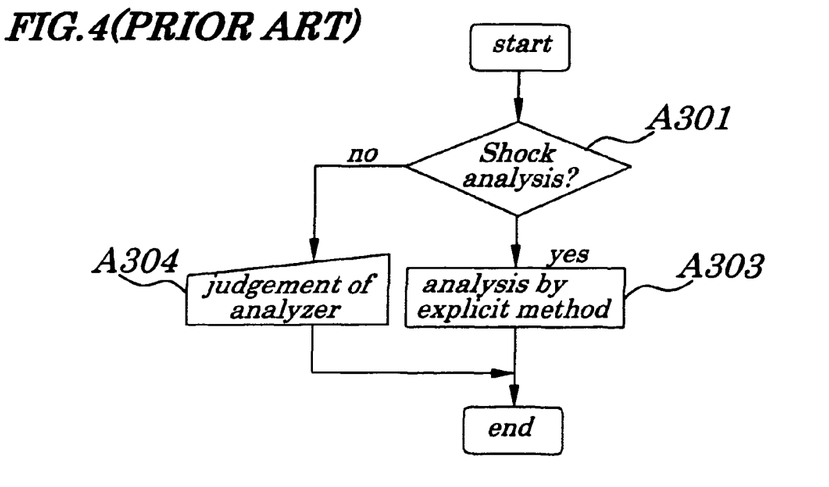
FIG. 4 is a flowchart showing one example of a processing operation in a conventional FEM analysis system.

Each of the implicit and explicit methods has an advantage and a disadvantage. As a result, the implicit method is used for the static analysis not requiring so much time and the explicit method is used, in most cases, for the dynamic analysis requiring much time. Under present circumstances, in an automobile industry having a most advanced drop shock (crash) analysis technology being a field of the present invention, in particular, the stress analysis is performed by using an explicit method-specific software typified by PAM-SHOCK and LS-DYNA. FIG. 4 is a flowchart showing one example of the analysis processing operation in a conventional FEM analysis system. That is, in Step A301, whether or not an analysis to be made is a shock analysis is judged and, if it is the shock analysis, the explicit method provided in Step A303 is used unconditionally and, if it is not the shock analysis, a subsequent process is relegated to a judgement of the analyzer in Step A304.

In such circumstances, sizes and weights of electronic devices are being reduced rapidly in recent years and a cellular phone or a like becomes widespread remarkably in particular, however, a problem occurs in that, when it is dropped while carrying it, a connected portion of an LSI chip embedded therein is broken. In order to evaluate connection reliability of portable electronic devices, an actual drop test is required using actual electronic devices, however, the experiment entails high costs and time. Therefore, a demand for reduction in costs required in such experiments for a drop shock analysis is increasing. In an attempt to respond to this demand, a method using a shock analysis technique cultivated through experiences in automobiles was tried by some universities, however, values calculated in experiments are not in agreement with actual phenomena, for example, reaction force (impact force) is extraordinarily larger (that is, larger by one to two digits) than calculated values and it is therefore expected that a new method of an analysis of a drop shock that can be used for the analysis of electronic devices is developed.

A reason why behavior (deformation of each part) and reaction force (impact force) are widely different from actual phenomena when the explicit method is used for a dynamic analysis, in particular, for a drop analysis of portable electronic devices is explained below.

When "$\Delta t_{ex}$" is defined to be an analysis time interval in the explicit method and "$\Delta t_{im}$" is defined to be an analysis time interval in the implicit method, a constraint in the implicit method is only a converging calculation of displacement obtained from an equilibrium equation in every step while the dynamic analysis is performed in the explicit method and therefore there is a following constraint (Courant condition) related to a minimum mesh size, longitudinal elastic modulus, and mass density:

$$\Delta t_{ex} < L/c \qquad \text{Expression (3)}$$

$$c = (E/\rho)^{1/2} \qquad \text{Expression (4)}$$

where "L" denotes a minimum mesh size in an analysis model, "c" denotes a propagation speed of an elastic wave, "E" denotes a longitudinal elastic modulus (also being called "Young's modulus") and "$\rho$" denotes mass density. Thus, since the explicit method has a property that it depends on the analysis time interval $\Delta t_{ex}$ and since the analysis time interval $\Delta t_{ex}$ has a constraint by a minimum mesh size "L" as shown in the expression (3), the analysis time interval $\Delta t_{ex}$ becomes too small in the analysis model for a small-sized portable electronic device. Therefore, a following expression (5) is given:

$$\alpha \approx v/\Delta t_{ex}, F = m\alpha \qquad \text{Expression (5)}$$

where "$\alpha$" denotes acceleration, "m" denotes a mass, "F" denotes reaction force, and "v" denotes a drop velocity. As a result, the calculation produces extremely large reaction force (impact force) F and different deformation occurs.

As one example, when a body is dropped from a height of 1000 mm, due to a law of conservation of energy, a following equation (6) is given:

$$v = (2gh)^{1/2} = 4400 \text{ mm/s} \qquad \text{Expression (6)}$$

where "g" denotes gravimetric acceleration and "h" denotes a dropped height. Since a phenomenon of about $5 \times 10^{-4}$ seconds is a problem in a drop of electronic devices, the acceleration "$\alpha$" and the reaction force "F" have following values.

$$\alpha = 4400 \times 10000/5 = 8 \times 10^6 \text{ mm/s}^2$$

$$F = 0.1 \times 8.8 \times 10^6 = 880N$$

As a convergence stabilizing condition in the explicit method, the analysis time interval $\Delta t_{ex}$ has to satisfy a following relation:

$$\Delta t_{ex} < L/c \text{ and}$$

$$c = (E/\rho)^{1/2}$$

If a solder ball diameter is 1.0 mm, a Young's modulus E=19600 N/mm², a density "$\rho$"=2×10⁻⁹ kg/mm³, c=3.2×10⁶ m/s. Here, if the solder ball diameter is divided into four portions, L/c=0.25/(3.2×10⁶) seconds=7.8×10⁻⁸ seconds.

Therefore, in order to analyze a drop phenomenon at a speed of 5×10⁻⁴ seconds, in the implicit method, by reducing the acceleration "α" to one tenth (that is, a digit is reduced by one), its analysis is made possible, while, in the case of the explicit method, an analysis time interval has to be reduced to one thousands.

As described above, if an analysis time interval is same, since a number of times of the analysis required to reach the value of 5×10⁻⁴ seconds becomes same, time required for a total analysis becomes more shorter in the explicit method in which time required for one time analysis becomes short because of use of an expression of a diagonal matrix compared with the implicit method.

However, if the analysis time interval required for satisfying conditions for stabilization in the explicit method becomes extraordinarily smaller compared with that in the implicit method because a fine mesh is contained like in the case of a model for portable electronic devices, a number of times of the explicit method=(analysis time interval in the implicit method/analysis time interval in the explicit method)×(number of times in the implicit method). As a result, due to an increased number of the analysis in the explicit method, time required for the total analysis is increased more in the explicit method compared with the implicit method.

Moreover, in the analysis during the very short time interval, there are some cases in which shock force increases and deformation state is not in agreement with an actual phenomenon. In the above example, in the case of the implicit method, a value approaching to a result from a calculation on paper can be acquired by using a shock force of about 980N, however, in the case of the explicit method, about one hundred-folded shock force is necessary.

SUMMARY OF THE INVENTION

In view of the above, it is an object of the present invention to provide an FEM analysis system which is capable of analyzing with high accuracy and with a short time in a drop shock analysis of electronic devices or a like in which an analysis result is very different from actual phenomena and in which a very small mesh size is incorporated.

According to a first aspect of the present invention, there is provided an analysis method using a finite element method for performing a stress analysis on an analysis model, including:
a first step of judging whether or not an analysis to be made is a shock analysis;
a second step of performing an analysis using an implicit method when the analysis to be made is judged to be a shock analysis in the first step; and
a third step of performing an analysis using an analysis method selected by an analyzer when the analysis to be made is judged to be not a shock analysis in the first step.

With the above configuration, whether or not an analysis to be made is a shock analysis is judged and when it is judged to be a shock analysis, an analysis is made using the implicit method. Therefore, a shock analysis using the explicit method is not performed in which a decrease in accuracy in an analysis and an increase in analysis time occur when a mesh size is made small and an FEM analysis using the implicit method is made in which a result from an analysis approaching to a real phenomena can be obtained within a short time.

In the foregoing, a preferable mode is one wherein a Newmarkβmethod is used as the implicit method.

According to a second aspect of the present invention, there is provided an analysis method using a finite element method for creating meshes of an analysis model and for making a stress analysis of the analysis model, the analysis method including:
a first step of judging whether an analysis to be made is a shock analysis;
a second step of searching for a minimum mesh size out of the meshes of the analysis model;
a third step of creating a simplified analysis model using the minimum mesh size;
a fourth step of analyzing the simplified analysis model by using an implicit method and an explicit method;
a fifth step of selecting either of the implicit method or the explicit method as an optimal method, based on a result from an analysis in the fourth step;
a sixth step of having an analyzer select either of the implicit method or the explicit method based on a result from the analysis in the forth step; and
a seventh step of analyzing the analysis model by using an analysis method selected in the fifth step or the sixth step.

With the above configuration, a simplified analysis model using a minimum mesh size of an analysis model is analyzed by the implicit method and explicit method. Based on a result from the analysis, either of the implicit method or the explicit method is selected as an optimal method and an FEM analysis is made by using the selected analysis method. Moreover, the analysis method can be selected by an analyzer and therefore it is possible to execute the FEM analysis in consideration of demands required for an analysis such as a desire for shortening analysis time or a desire for placing importance on analysis accuracy.

In the foregoing, a preferable mode is one wherein a Newmarkβmethod is used as the implicit method.

Also, a preferable mode is one wherein, in the fifth step, when a following expression holds, $$T_{im} < T_{ex}$$

Where the "$T_{im}$" denotes analysis time required for the implicit method and "$T_{ex}$" denotes analysis time required for the explicit method, the implicit method is selected while, when above the expression does not hold, the explicit method is selected.

Also, a preferable mode is one wherein, in the fifth step, when a following expression holds, $$abs(E-S_{im}) < abs(E-S_{ex})$$

where the "abs" denotes an absolute value, the "$S_{im}$" denotes an analysis result containing data on displacement, stress, and distortion obtained from the implicit method, the "$S_{ex}$" denotes an analysis result containing data on displacement, stress, and distortion obtained from the explicit method, and the "E" denotes a result containing data on displacement, stress, and distortion obtained from the implicit method including an experiment value and an exact solution of a theoretical expression and from a method other than the explicit method, the implicit method is selected while, when above the expression does not hold, the explicit method is selected.

Also, a preferable mode is one wherein, in the sixth step, the analyzer is allowed to select an analysis method based on a relation between analysis time required for the implicit method "$T_{im}$" and analysis time required for the explicit method "$T_{ex}$" and based on a relation among an analysis result "$S_{im}$" containing displacement, stress, and distortion obtained from the implicit method, an analysis result "$S_{ex}$" containing displacement, stress, and distortion obtained from the explicit method, and a result "E" containing displacement, stress, and distortion obtained from the implicit method including an experiment value and an exact solution of a theoretical expression and from a method other than the explicit method.

According to a third aspect of the present invention, there is provided a program for having a computer make an analysis using a finite element method used to perform a stress analysis of an analysis model: the program including:

a first step of judging whether or not an analysis to be made is a shock analysis;

a second step of performing an analysis using an implicit method when the analysis to be made is judged to be a shock analysis in the first step;

a third step of performing an analysis by using an analysis method selected by an analyzer when the analysis to be made is judged to be not a shock analysis in the first step.

In the foregoing, a preferable mode is one wherein a Newmarkβmethod is executed by a computer as the implicit method.

According to a fourth aspect of the present invention, there is provided a program for having a computer execute an analysis using a finite element method which creates meshes of an analysis model and performs a stress analysis of the analysis model, the program including:

a first process of judging whether or not an analysis to be performed is a shock analysis;

a second process of searching for a minimum mesh size out of the meshes of the analysis model;

a third process of creating a simplified analysis model using the minimum mesh size;

a fourth process of analyzing the simplified analysis model by using an implicit method and an explicit method;

a fifth process of selecting either of the implicit method or the explicit method as an optimal method, based on a result from the analysis in the fourth process;

a sixth process of having an analyzer select either of the implicit method or the explicit method based on a result from the analysis in the fourth process; and a seventh process of analyzing the analysis model by using an analysis method selected in the fifth process or the sixth process.

In the foregoing, a preferable mode is one wherein a Newmarkβmethod is executed by a computer as the implicit method.

Also, a preferable mode is one wherein, in the fifth process, when a following expression holds, $$T_{im} < T_{ex}$$

Where the "$T_{im}$" denotes analysis time required for the implicit method and the "$T_{ex}$" denotes analysis time required for the explicit method, the implicit method is selected while, when above the expression does not hold, the explicit method is selected.

Also, a preferable mode is one wherein, in the fifth process, when a following expression holds, $$\text{abs}(E-S_{im}) < \text{abs}(E-S_{ex})$$

where the "abs" denotes an absolute value, the "$S_{im}$" denotes an analysis result containing data on displacement, stress, and distortion obtained from the implicit method, the $S_{ex}$ denotes an analysis result containing data on displacement, stress, and distortion obtained from the explicit method, and the "E" denotes a result containing data on displacement, stress, and distortion obtained from the implicit method including an experiment value and an exact solution of a theoretical expression and from a method other than the explicit method, the implicit method is selected while, when above the expression does not hold, the explicit method is selected.

Also, a preferable mode is one wherein, in the sixth process, the analyzer is allowed to select an analysis method based on a relation between the analysis time required for the implicit method "$T_{im}$" and the analysis time required for the explicit method "$T_{ex}$" and based on a relation among an analysis result "$S_{im}$" containing displacement, stress, and distortion obtained from the implicit method, an analysis result "$S_{ex}$" containing displacement, stress, and distortion obtained from the explicit method, and a result "E" containing displacement, stress, and distortion obtained from the implicit method including an experiment value and an exact solution of a theoretical expression and from a method other than the explicit method.

According to a fifth aspect of the present invention, there is provided a finite element method analysis system having a unit for creating meshes of an analysis model and having a unit for making an analysis using a finite element method used to perform a stress analysis on the analysis model using the finite element method, the finite element method analysis system including:

a first unit to judge whether or not an analysis to be made is a shock analysis;

wherein, when the analysis to be performed by the unit for making the analysis using the finite element method is judged by the first unit to be a shock analysis, an analysis is made by using an implicit method and wherein, when the analysis to be performed by the unit making the analysis using the finite element method is judged by the first unit to be not a shock analysis, the analysis is made by using an analysis method selected by an analyzer.

In the foregoing, a preferable mode is one wherein the unit making the analysis using the finite element method performs a Newmarkβmethod as the implicit method.

According to a sixth aspect of the present invention, there is provided a finite element method analysis system having a unit for creating meshes of an analysis model and having a unit for making an analysis using a finite element method used to perform a stress analysis on the analysis model using the finite element method, the finite element method analysis system including:

a first section to judge whether or not an analysis to be performed is a shock analysis;

a second section to search for a minimum mesh size out of the meshes of the analysis model;

a third section to create a simplified analysis model using the minimum mesh size;

a fourth section to select either of the implicit method or the explicit method as an optimal method, based on a result from a simplified analysis in which the simplified analysis model is analyzed by a unit for making an analysis using a finite element method by using an implicit method and an explicit method;

a fifth section to have an analyzer select either of the implicit method or the explicit method as an analysis method based on a result from the simplified analysis; and wherein the unit for making an analysis using a finite element method analyzes the analysis model by using the fourth section or the fifth section.

In the foregoing, a preferable mode is one wherein the unit making the analysis using the finite element method performs a Newmarkβmethod as the implicit method.

Also, a preferable mode is one wherein, the fourth section, when a following expression holds, $$T_{im} < T_{ex}$$

where the "$T_{im}$" denotes analysis time required for the implicit method and the "$T_{ex}$" denotes analysis time required for the explicit method, selects the implicit method while, when above the expression does not hold, selects the explicit method.

Also, a preferable mode is one wherein, the fourth section, when a following expression holds, $$abs(E-S_{im}) < abs(E-S_{ex})$$

where the "abs" denotes an absolute value, the "$S_{im}$" denotes an analysis result containing data on displacement, stress, and distortion obtained from the implicit method, the $S_{ex}$ denotes an analysis result containing data on displacement, stress, and distortion obtained from the explicit method, and the "E" denotes a result containing data on displacement, stress, and distortion obtained from the implicit method including an experiment value and an exact solution of a theoretical expression and from a method other than the explicit method, selects the implicit method while, when above the expression does not hold, selects the explicit method.

Also, a preferable mode is one wherein the fifth section has the analyzer select an analysis method based on a relation between analysis time required for the implicit method "$T_{im}$" and analysis time required for the explicit method "$T_{ex}$" and based on a relation among an analysis result "$S_{im}$" containing displacement, stress, and distortion obtained from the implicit method, an analysis result "$S_{ex}$" containing displacement, stress, and distortion obtained from the explicit method, and a result "E" containing displacement, stress, and distortion obtained from the implicit method including an experiment value and an exact solution of a theoretical expression and from a method other than the explicit method.

With the above configuration, whether an analysis is made by the explicit method or whether the analysis is made by the implicit method can be selected according to an analysis model. Since an analysis can be performed on an analysis model using an optimal method, an analysis result can be obtained with high accuracy and within a short time.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
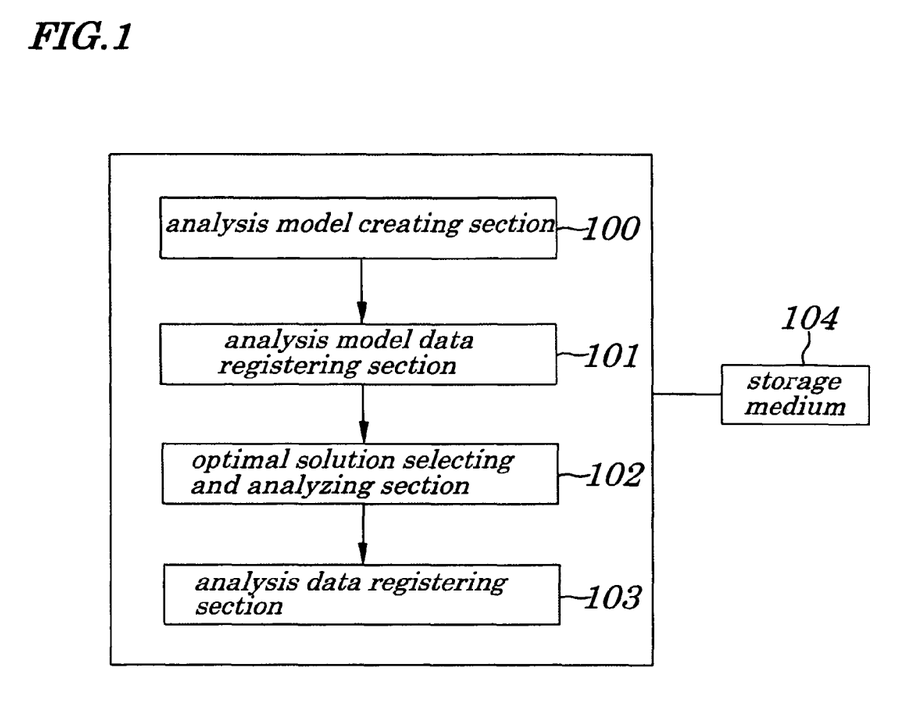
FIG. 1 is a schematic diagram showing an FEM analysis system according to a first embodiment of the present invention.

FIG. 1 is a schematic block diagram showing an FEM analysis system according to an embodiment of the present invention. As shown in FIG. 1, the FEM analysis system of the embodiment includes an analysis model creating section 100, an analysis model data registering section 101 to store analysis model data to a file, an optimal solution selecting and analyzing section 102, and an analysis data registering section 103 to store analysis data to a file.

Rough operations of each of the above sections are as follows.

The analysis model creating section 100, after having performed a meshing process (that is, after having discretized a shape using an element) based on CAD (Computer-Aided Design) data or after having created shape data from a preprocessor to be exclusively used for an analysis and having performed a meshing process, adds a boundary condition required for the analysis to a model.

The analysis model data registering section 101 registers analysis model data created by the analysis model creating section 100 on a specified file in a storage medium 104.

The optimal solution selecting and analyzing section 102 judges which method can perform an analysis, with high accuracy and within a short time, on analysis model data registered by the analysis model data registering section 101, the implicit method or the explicit method, and analyzes the data by the selected method.

Finally, the analysis data registering section 103 registers data analyzed by the optimal solution selecting and analyzing section 102 on a specified file in the storage medium 104.

Figure 2:
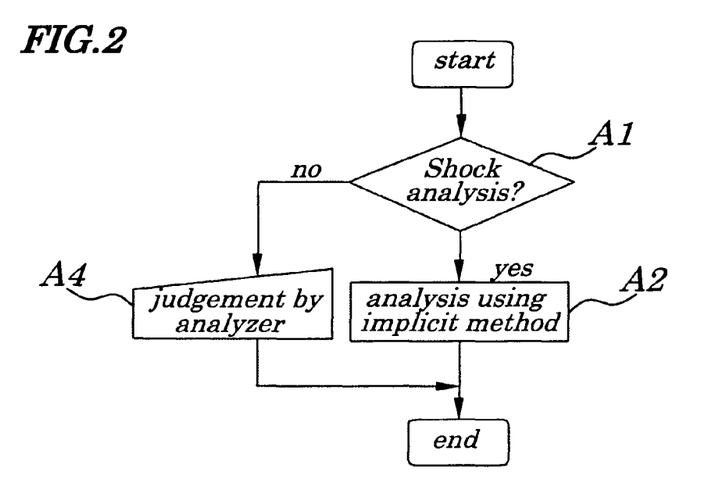
FIG. 2 is a flowchart showing a processing operation to be performed by an optimal solution selecting and analyzing section in the FEM analysis system of the first embodiment of the present invention.

Next, operations of the entire FEM analysis system are described in detail by referring to the block diagram in FIG. 1 and to the flowchart in FIG. 2.

As shown in the schematic block diagram in FIG. 1, in the analysis model creating section 100 of the first embodiment, after a meshing process has been performed based on CAD data or after shape data has been formed from a preprocessor being exclusively used for analysis and then the meshing process has been performed, boundary conditions required for analysis are added to a model.

Next, in the analysis model data registering section 101, an analysis model data created by the analysis model creating section 100 is registered on a specified file in the storage medium 104.

Moreover, in the optimal solution selecting and analyzing section 102, which method can perform an analysis, with high accuracy and within a short time, on analysis model data registered by the analysis model data registering section 101 on a specified file in the storage medium 104 is judged, the implicit method or the explicit method, and the data is analyzed using the selected method.

Finally, in the analysis data registering section 103, data analyzed by the optimal solution selecting and analyzing section 102 is stored in a specified file in the storage medium 104.

Especially, a method for selecting an optimal solution and for analyzing by the optimal solution selecting and analyzing section 102 serving as a characteristic portion of the present invention is described by referring to the flowchart in FIG. 2.

First, in a step (A1 in FIG. 2) in which checking is made on whether or not an analysis to be made is a shock analysis, a judgement is made as to whether processing to be performed by the optimal solution selecting and analyzing section 102 is a shock analysis or not and, if the above processing is a shock analysis, an analysis using the implicit method is executed in a step (A2 in FIG. 2) in which the implicit method is to be performed. If the processing is other than the shock analysis, processing is relegated to a judgement of an analyzer in a next step (A4 in FIG. 2).

Moreover, in the optimal solution selecting and analyzing section 102, a Newmarkβmethod is preferably used as the implicit method. The implicit method can be roughly classified into two types, one being the Newmarkβmethod and another being a Houbalt method. Research by the inventor shows that, when the Newmarkβmethod is used, a value approaching to a result from a calculation on paper is obtained, however, when the Houbalt method (cubic function interpolation) is used, the value becomes near to a result from an analysis performed using the explicit method. Therefore, though all the methods being called the implicit method are not always suitable to a drop analysis of electronic devices, a method that can be used for the drop analysis is not limited to the Newmarkβmethod applied to the embodiment of the present invention.

As explained above, in the embodiment, when a shock analysis is performed on electronic device models or a like having a portion with a very small mesh size, an analysis using the implicit method is selected. Therefore, by using the FEM analysis system of the embodiment of the present invention, unlike in the case of using the FEM analysis system using the explicit method in which a decrease in analysis accuracy and an increase in analysis time occur when a mesh size becomes minute, a highly accurate analysis result approaching to a real phenomenon can be obtained within a short time.

Second Embodiment

Processing in an FEM analysis system of a second embodiment is same as that of the first embodiment except processing to be performed in an optimal solution selecting and analyzing section 102 and their descriptions are omitted accordingly. In the second embodiment, same reference numbers are assigned to corresponding to configurations and processing of the FEM analysis system as in the first embodiment.

Figure 3:
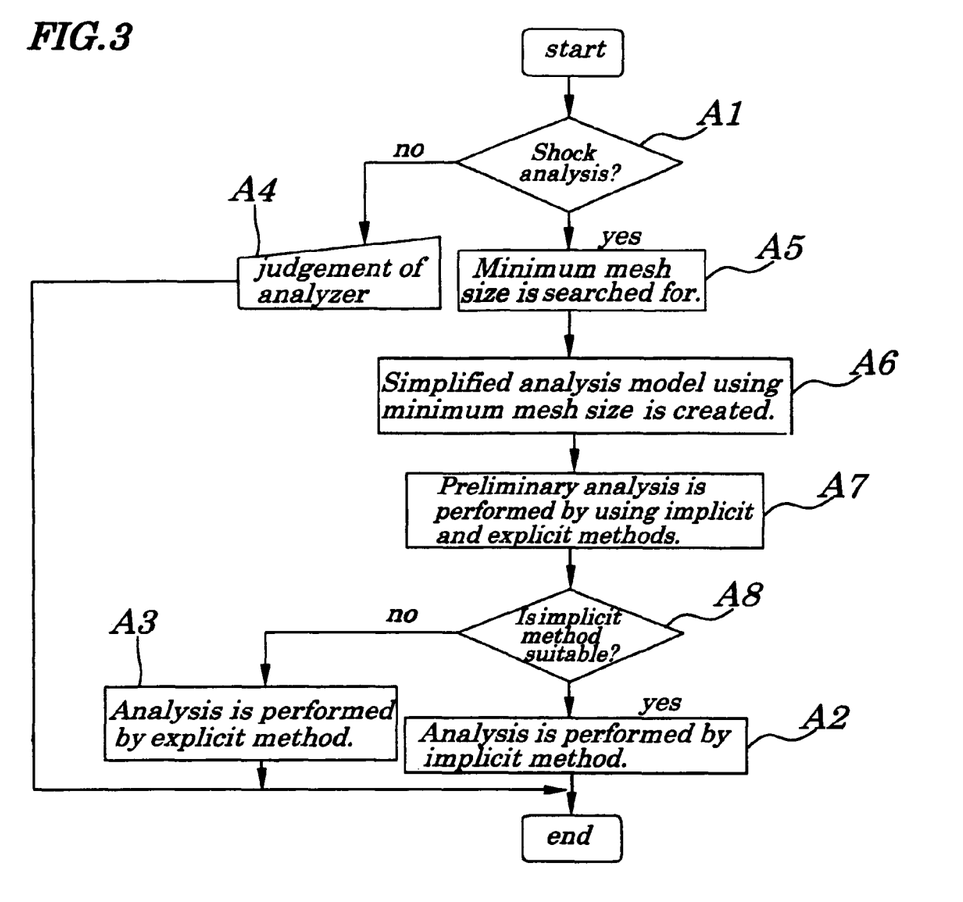
FIG. 3 is a flowchart showing a processing operation to be performed by an optimal solution selecting and analyzing section in an FEM analysis system of the second embodiment of the present invention.

FIG. 3 is a flowchart showing processing operations to be performed by the optimal solution selecting and analyzing section 102 in the FEM analysis of the second embodiment of the present invention.

As shown in the flowchart in FIG. 3, the optimal solution selecting and analyzing section 102 performs processing in Step A1 in which checking is made on whether or not an analysis to be made is a shock analysis, processing in Step A5 in which a minimum mesh size is searched for, processing in Step A6 in which a simplified analysis model is created using a minimum mesh size, processing in Step A7 in which a preliminary analysis is performed by an implicit method and by an explicit method, processing in Step A8 in which an analysis method is selected based on an analysis result, processing in Step A2 in which an analysis is performed using an implicit method, processing in Step A3 in which an analysis is performed using an explicit method, and processing in Step A4 in which a process is relegated to a judgement of an analyzer.

Next, operations of an entire FEM analysis system will be described by referring to the flowchart in FIG. 3.

First, in the step (A1 in FIG. 3) in which checking is made as to whether an analysis to be made is a shock analysis, the analysis to be made is judged to be a shock analysis, the processing proceeds to a step (A5 in FIG. 3) in which a minimum mesh size is searched for and if the analysis to be made is judged to be an analysis other than the shock analysis, the routine proceeds to a next step (A4 in FIG. 3) in which a process is relegated to a judgement of an analyzer and the routine is terminated.

If an analysis to be made is judged to be a shock analysis and the routine proceeds to a step (A5 in FIG. 3) in which a minimum mesh size is searched for, in a step (A6 in FIG. 3) in which a simplified analysis model is created by using a minimum mesh size, mesh cutting processing is performed by using a minimum mesh size obtained by an automatic mesh function is step A5 on CAD data having a simplified shape that has been already registered and an FEM analysis model is produced. Moreover, in a step (A7 in FIG. 3) in which an analysis is performed by using the implicit method and the explicit method, a preliminary analysis is performed using a simplified model based on the both the methods.

Next, an analysis method is determined in a step (A8 in FIG. 3) in which an optimal analysis method is to be selected based on a result from a preliminary analysis. If a following expression holds in the preliminary analysis, $$T_{im} < T_{ex} \quad \text{Expression (1)}$$

where "$T_{im}$" denotes analysis time required for the implicit method and "$T_{ex}$" denotes analysis time required for the explicit method, that is, if, in the preliminary analysis, the analysis time required for the implicit method is shorter than that required for the explicit method, the routine proceeds to a step (A2 in FIG. 3) in which the analysis using the implicit method is performed in order to perform the analysis by the implicit method. On the other hand, if a relation between the analysis time "$T_{im}$" and the analysis time "$T_{ex}$" does not satisfy the above expression (1), that is, if the analysis time required for the explicit method is shorter than that required for the implicit method, the routine proceeds to a step (A3 in FIG. 3) in which an analysis by the explicit method is performed in order to perform the analysis by the explicit method.

Thus, by using the expression (I) as a reference for selection of the analysis method, a method that can perform an analysis within a short time can be selected.

Moreover, selection of the analysis method in a step (A8 in FIG. 3) in which an optimal analysis method is selected may be made in a way other than that using the above expression (1).

That is, if a following expression (2) holds, an analysis is made by using a model causing the analysis to be performed in the step (A2 in FIG. 3) in which the implicit method is used; otherwise, the analysis is made by using a model causing the analysis to be performed in the step (A3 in FIG. 3) in which the explicit method is used:

$$\text{abs}(E-S_{im}) < \text{abs}(E-S_{ex}) \quad \text{Expression (2)}$$

where the "abs" denotes an absolute value, "$S_{im}$" denotes an analysis result including data on displacement, stress, distortion, or a like obtained by the implicit method in the preliminary analysis in Step A7, "$S_{ex}$" denotes an analysis result including data on displacement, stress, distortion, or a like obtained by the explicit method, and "E" denotes a result obtained by an experiment including data on displacement, stress, distortion, or a like or an exact solution obtained from a theoretical expression.

Thus, by using an analysis method given by the expression (2) as a reference for selection, a simplified model based on a minimum mesh size of a model to be analyzed can be created, a preliminary analysis can be made by actually using both methods, an analysis method having less errors can be selected by making a comparison between an analysis result obtained by the preliminary analysis and a result obtained from an experiment or an exact solution, which enable highly accurate acquirement of analysis results.

The method that can satisfy the expressions (1) and the method that can satisfy the expression (2) are not always same and, in the case of the analysis handling enormous numbers of meshes, even if some discrepancies occur between results obtained by using the above methods and results obtained by experiments, it is possible to select a method which requires less time.

To respond to such cases, an analyzer may select an analysis method by adding the step A4 in which a judgement is made by the analyzer after the step (A8 in FIG. 3) in which an analysis method is determined based on the analysis result and by making a comparison between the expression (1) allowing selection of the method in which a result can be obtained within a short time and the expression (2) allowing selection of the method providing a highly accurate analysis. In this case, the analyzer can select a method that the analyzer desires from a viewpoint of analysis time and analysis accuracy.

As described above, in the first embodiment as shown by the flowchart in FIG. 2, if, an analysis to be performed, in step A1 in which checking is made as to whether or not the analysis to be made is a shock analysis, is judged to be a shock analysis, an analysis using the implicit method is made in Step A2. While, in the second embodiment as shown by the flowchart in FIG. 3, by performing procedures shown in Steps A5 to A8, a simplified model based on a minimum mesh size of a model to be analyzed is created and an preliminary analysis is made by the implicit method or the explicit method in a separate manner.

Thus, according to the FEM analysis system of the second embodiment, like in the case of the first embodiment, when a shock analysis to be performed on electronic device models or a like having portions being very small in a mesh size is made, an analysis result approaching to actual phenomena can be obtained with high accuracy within a short time. Moreover, in the FEM analysis system of the second embodiment, after a simplified model has been created based on a minimum mesh size of a model to be analyzed, a preliminary analysis using both the methods and therefore an optimal method to be applied to an individual model can be selected with high accuracy.

It is apparent that the present invention is not limited to the above embodiments but may be changed and modified without departing from the scope and spirit of the invention.

What is claimed is:

1. An analysis method for performing a stress analysis of a device using a finite element method to analyze a first analysis model having meshes that define a discretized shape of the device, the analysis method implemented in a computer, the analysis method comprising:
    searching for a minimum mesh size out of the meshes of the first analysis model;
    creating a second analysis model having one or more meshes that define a shape of a simplified device different than the discretized shape of the device using the minimum mesh size, wherein the second analysis model is different from the first analysis model;
    analyzing the second analysis model by using an implicit method to obtain a first analysis time;
    analyzing the second analysis model by using an explicit method to obtain a first analysis time;
    comparing the first analysis time with the second analysis time to obtain a comparison result;
    selecting one of the implicit method or the explicit method based on the comparison result, wherein the selected one of which has a shorter analysis time;
    analyzing the first analysis model using the selected method to obtain an analysis result for the stress analysis of the device, the analysis result including data on at least one of displacement, stress, or distortion; and
    storing the analysis result in a storage medium,
    wherein the simplified device comprises a simplified shape of the device,
    wherein the different shape is a simplified shape as compared to the discretized shape, and
    wherein the second analysis model is a simplified analysis model as compared to the first analysis model.

2. The analysis method of claim 1, wherein analyzing the first analysis model using the selected method, comprises:
    analyzing the first analysis model using only the selected method to obtain the analysis result.

3. A computer-readable storage medium storing a program for causing a computer to execute an analysis process for performing a stress analysis of a device using a finite element method to analyze a first analysis model having meshes that define a discretized shape of the device, the analysis process comprising:
    searching for a minimum mesh size out of the meshes of the first analysis model;
    creating a second analysis model having one or more meshes that define a shape of a simplified device different than the discretized shape of the device using the minimum mesh size, wherein the second analysis model is different from the first analysis model;
    analyzing the second analysis model by using an implicit method to obtain a first analysis time;
    analyzing the second analysis model by using an explicit method to obtain a first analysis time;
    comparing the first analysis time with the second analysis time to obtain a comparison result;
    selecting one of the implicit method or the explicit method based on the comparison result, wherein the selected one of which has a shorter analysis time;
    analyzing the first analysis model by using the selected method to obtain an analysis result for the stress analysis of the device, the analysis result including data on at least one of displacement, stress, or distortion; and
    storing the analysis result in a storage medium,
    wherein the simplified device comprises a simplified shape of the device,
    wherein the different shape is a simplified shape as compared to the discretized shape, and
    wherein the second analysis model is a simplified analysis model as compared to the first analysis model.

4. The computer-readable storage medium of claim 3, wherein analyzing the first analysis model using the selected method, comprises:
analyzing the first analysis model using only the selected method to obtain the analysis result.

5. A finite element method analysis system for performing a stress analysis of a device, the finite element method analysis system comprising a computer configured to:
create a first analysis model having meshes that define a discretized shape of the device;
search for a minimum mesh size out of the meshes of the first analysis model;
create a second analysis model having one or more meshes that define a shape of a simplified device different than the discretized shape of the device using the minimum mesh size, wherein the second analysis model is different from the first analysis model;
analyze the second analysis model by using an implicit method to obtain a first analysis time;
analyze the second analysis model by using an explicit method to obtain a first analysis time;
compare the first analysis time with the second analysis time to obtain a comparison result;
select one of the implicit method or the explicit method based on the comparison result, wherein the selected one of which has a shorter analysis time;
analyze the first analysis model using the selected method to obtain an analysis result for the stress analysis of the device, the analysis result including data on at least one of displacement, stress, or distortion; and
store the analysis result in a storage medium,
wherein the simplified device comprises a simplified shape of the device,
wherein the different shape is a simplified shape as compared to the discretized shape, and
wherein the second analysis model is a simplified analysis model as compared to the first analysis model.

6. The finite element method analysis system of claim 5, wherein the computer is configured to analyze the first analysis model using only the selected method to obtain the analysis result.

* * * * *